US010015454B2

(12) United States Patent
Goetschalckx et al.

(10) Patent No.: US 10,015,454 B2
(45) Date of Patent: Jul. 3, 2018

(54) IMAGE SENSOR

(71) Applicant: IMEC VZW, Leuven (BE)

(72) Inventors: Paul Goetschalckx, Sint-Katelijne-Waver (BE); Bruno Jozef Arthur Mollekens, Boortmeerbeek (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 14/918,339

(22) Filed: Oct. 20, 2015

(65) Prior Publication Data
US 2016/0134847 A1    May 12, 2016

(30) Foreign Application Priority Data

Nov. 6, 2014    (EP) ..................................... 14192092
Jan. 21, 2015    (EP) ..................................... 15151893

(51) Int. Cl.
*H04N 9/04*    (2006.01)
*H04N 5/3745*    (2011.01)
*H03M 1/12*    (2006.01)
*H04N 5/378*    (2011.01)
(Continued)

(52) U.S. Cl.
CPC ............. *H04N 9/045* (2013.01); *H04N 5/357* (2013.01); *H04N 5/378* (2013.01); *H04N 5/37455* (2013.01); *H04N 9/64* (2013.01); *H03M 1/123* (2013.01)

(58) Field of Classification Search
None
See application file for complete search history.

(56) References Cited

U.S. PATENT DOCUMENTS

2004/0068703 A1*  4/2004  Maehara ................. G06F 17/50
                                                      716/102
2008/0109504 A1*  5/2008  McDonald ............ G06F 1/0328
                                                      708/275
(Continued)

OTHER PUBLICATIONS

Gabrielli, A., et al. "Proposal of a data sparsification unit for a mixed-mode MAPS detector." IEEE Nuclear Science Symposium Conference Record, 2007. pp. 1471-1473.
(Continued)

*Primary Examiner* — Mark T Monk
(74) *Attorney, Agent, or Firm* — Knobbe, Martens, Olson & Bear LLP

(57) ABSTRACT

An image sensor for converting incident light into digital signals is disclosed. In one aspect, the image sensor includes a matrix of light-sensitive pixels arranged in a plurality of pixel columns each having a predetermined lateral extent. The image sensor includes an analog-to-digital converter block including a plurality of analog-to-digital converters (ADCs). Each of the plurality of ADCs includes an analog processing portion adapted to receive at least one analog signal from a pixel column of the matrix and to generate at least one digital signal from the received analog signal. Each of the plurality of ADCs includes a digital processing portion adapted to receive said at least one digital signal from said corresponding analog processing portion. The lateral extent of at least one of the digital processing portions is greater than the lateral extent of its corresponding analog processing portion.

20 Claims, 4 Drawing Sheets

(51) Int. Cl.
*H04N 5/357* (2011.01)
*H04N 9/64* (2006.01)

(56) References Cited

U.S. PATENT DOCUMENTS

2013/0020469 A1* 1/2013 Okura ................. H04N 5/3742
250/208.1
2014/0226049 A1* 8/2014 Utsunomiya .......... H04N 5/374
348/302

OTHER PUBLICATIONS

Gielen, Georges G.E., and Rob A. Rutenbar. "Computer-Aided Design of Analog and Mixed-Signal Integrated Circuits." Proceedings of the IEEE, Dec. 2000. pp. 1825-1852, vol. 88, No. 12.

Nelson, Fan Z and Suat U. Ay. "Integration of a New Column-Parallel ADC Technology on CMOS Image Sensor." 2010 IEEE Workshop on Microelectronics and Electron Devices (WMED), Apr. 2010. pp. 1-4.

Paris, L., et al. "Floorplanning strategy for mixed analog-digital VLSI integrated circuits." IEEE EDAC Proceedings of the European Conference on Design Automation, Feb. 1991. pp. 346-350.

Shin, Min-Seok, et al. "A 1.92-Megapixel CMOS Image Sensor With Column-Parallel Low-Power and Area-Efficient SA-ADCs." IEEE Transactions on Electron Devices, Jun. 2012. pp. 1693-1700, vol. 59, No. 6.

Tanner, Steve, et al. "An 8-bit Low-Power ADC Array for CMOS Image Sensors." IEEE International Conference on Electronics, Circuits and Systems, 1998. pp. 147-150.

Wolff, Francis G., et al. "Using Codesign Techniques to Support Analog Functionality." Proceedings of the Seventh International Workshop on Hardware/Software Codesign,1999, May 1999. pp. 79-83.

\* cited by examiner

IMAGE SENSOR

RELATED APPLICATIONS

This application claims priority to EP 14192092.6 filed Nov. 6, 2014, entitled "IMAGE SENSOR," and EP 15151893.3 filed Jan. 21, 2015, entitled "IMAGE SENSOR," each of which is incorporated herein by reference in its entirety.

BACKGROUND

Field

The present description relates to the field of image sensors, and more particularly to image sensors with integrated analog-to-digital converters.

Description of the Related Technology

Conventional image sensors include a matrix of light sensitive pixels (otherwise referred to as a pixel matrix) adapted to convert incident light into analog signals. Image sensors may integrate analog-to-digital converters (ADCs) are integrated with such a pixel matrix so as to convert analog signals from the matrix into digital signals.

To reduce fixed pattern noise in sensed images the ADCs are arranged on a column-by-column basis and designed for maximum similarity.

Due to the limited width of columns in which the ADCs must be fit, such ADCs are typically bespoke or hand-designed to each image sensor. This manual design methodology is time-consuming and requires a high-level of designer skill. It also prevents changes from being quickly and easily implemented where new and/or modified designs are required.

SUMMARY OF CERTAIN INVENTIVE ASPECTS

The disclosed technology includes an image sensor for converting incident light into digital signals. The image sensor includes a matrix of light-sensitive pixels, the matrix being arranged in a plurality of pixel columns each having a first lateral extent. The image sensor includes an analog-to-digital converter (ADC) block comprising a plurality of analog-to-digital converters (ADCs). Each ADC includes an analog processing portion and a digital processing portion. The analog processing portion receives analog signals from a pixel column of the matrix and generates digital signals from the received analog signals. The digital processing portion receives signals from an analog processing portion and processes them using a digital processing resource or capability. The lateral extent of the digital processing portion is greater than the lateral extent of the analog processing portion.

In an embodiment, each of the plurality of ADCs includes an analog processing portion adapted to receive analog signals from a pixel column of the matrix and to generate digital signals from the received analog signals. In an embodiment, each of the plurality of ADCs includes a digital processing portion adapted to receive digital signals from the analog processing portion. Further, the lateral extent of at least one of the digital processing portions may be greater than the lateral extent of its corresponding analog processing portion.

In an embodiment, each ADC of the ADC block is adapted to receive and process signals from a corresponding pixel column of the matrix. While the analog processing portion of a single ADC may be restricted to being no wider than the respective column(s) of the pixel matrix from which it receives analog signals, the width of the digital processing portion of the single ADC need not be restricted in the same way. Instead, by arranging the digital processing portion of the ADC to have a width (e.g. lateral extent) larger than the analog processing portion of the ADC, the digital processing portion may have a flexible and irregular structure which is not limited by the pitch (i.e. width) of the pixel columns of an associated matrix.

In an embodiment, the analog processing portion of a single ADC may be otherwise restricted to being no wider than two times the lateral extent of a pixel column.

References to 'pitch', 'lateral extent' or 'width' of pixel columns (or "column pitch") should be taken to mean the lateral distance between the equivalent (or same) parts of pixels in neighboring pixel columns. It may therefore be understood to refer to the width or lateral extent of each pixel column in a pixel matrix. For example, if each pixel column in a matrix is an identical size, their respective lateral extent (or pitch) may be calculated by dividing the total lateral distance of the pixel matrix by the number of pixel columns in said pixel matrix, apportioning each pixel column the same lateral distance (or pitch).

For example, if the total lateral extent of the matrix of light sensitive pixels is 20 μm, and is arranged into 8 identically sized pixel columns, each respective pixel column could be considered to have a lateral extent of 2.5 μm. The pitch (or column pitch) of such an example would therefore be considered to be 2.5 μm.

The disclosed technology includes embodiments for which the digital processing portion of individual ADCs have a lateral extent which exceeds that of the analog processing portion of the ADC (in other words, the analog processing portion from which it receives signals). Wider digital processing portions enable the use of modern, automated digital design processes to design and/or arrange the digital processing portion of an ADC. Therefore, relaxing the size constraints of the digital processing portion of an ADC (imparted by the width/pitch of pixel columns in the associated pixel matrix, for example) can facilitate implementation of computer aided design (CAD) methodologies which support design and/or layout of the digital processing portion.

Embodiments may therefore allow for accurate timing analysis to be undertaken, including post layout extraction by digital design tools. This overcomes an issue associated with hand-crafted designs where one is required to use an analog circuit simulator which may be unable to handle complex digital processing design analysis.

Embodiments may also enable automatic measures for Design for Manufacturability like automatic test insertion (such as scan chains or built in self test), which may provide an improvement in test time and/or test quality.

To aid understanding, reference to an analog processing portion and a digital processing portion of an ADC is meant to highlight how a single ADC may be split into two parts based on the nature of the signal(s) processed by the ADC.

An analog processing portion of an ADC is the portion which is arranged to input at least one analog signal having an infinite number (continuous range) of acceptable values. The analog processing portion may be arranged to output at least one digital signal having a discrete set of acceptable values. The analog processing portion of an ADC includes circuitry that processes analog signals with continuous values, such as continuums of a signal or entity (like voltage, current, charge, etc.). In an implementation, an analog processing portion may be a circuit including at least one component that inputs, processes, or outputs an analog signal, which is a non-binary, non-discrete signal.

A digital processing portion of an ADC is the portion which is arranged to only input and output digital signals. Digital signals differ from analog signals in that they have a discrete set of acceptable values. The digital processing portion of an ADC includes circuits that input, process, or output digital (for example, binary) information. In an implementation, a digital processing portion may be a circuit including at least one component that inputs, processes, or outputs a digital signal, which may be a binary, discrete signal.

The transition from an analog circuit to a digital circuit is typically made by a comparator circuit which compares an analog property against one or more threshold values in order to assign it to one of a limited set of acceptable values (e.g. a logic 1 or logic 0). The comparator itself is regarded to be an analog circuit because only its output is digital in nature.

The transition from a digital circuit to an analog circuit is typically made by a digital to analog Converter (DAC) which takes a digital signal (e.g. a digital word represented by a parallel set of bits) and converts this to an analog value (e.g. a certain voltage within a voltage range). The DAC itself is regarded to be an analog circuit because only its input is digital in nature. Furthermore, in a transition from a digital circuit to an analog circuit, digital signals can control switches inside the analog circuit.

Thus, an analog processing portion of an ADC may provide digital signals to an associated digital processing portion of the ADC. The digital processing portion of the ADC may then input/receive these signals for further processing. Further, the digital processing portion of an ADC may also be adapted to feed signals back to the analog processing portion. In other words, the analog processing portion and the digital processing portion may be arranged to exchange digital signals. The term "exchange" should therefore be understood in the "broad sense" as referring to either a one way (such as from analog to digital) or two-way (such as analog to digital and back) exchange of signals. In an embodiment, the analog processing portion of each of the plurality of ADCs may be designed and laid out with the same or similar constraints as in a conventional ADC for a pixel matrix. This may help to ensure a best fit with a matrix of light-sensitive pixels and/or attend to numerous similarity requirements.

In other words, to limit the effect of, for example, fixed pattern noise, it may be beneficial to maximize the similarity of the analog processing portion of a plurality of ADCs on column-to-column basis. Therefore, embodiments may limit the lateral extent of the analog processing portion to not exceed that of one or two pixel columns.

To ensure a sufficient lateral width such that digital design concepts may be employed when designing the architecture or layout of the digital processing portion of an ADC, an implementation may provide the digital processing portion of an ADC with as much lateral space as viable or practical. This may enable a larger lateral extent to be allocated for the arrangement of the digital processing portion.

In an embodiment, the matrix of light-sensitive pixels may include at least 8 pixel columns and the ADC block may include at least 8 ADCs. Each ADC has an analog processing portion and a digital processing portion. For each of the at least 8 ADCs, the lateral extent of its digital processing portion may be greater than the lateral extent of its analog processing portion. In an embodiment, the matrix includes more than 8 pixel columns, such as 16, 32, 64, 128, 256, 512, 1024, 2048, 4096, 8192, or more columns that receive signals. The received signals may be processed in the ADC block by a corresponding number of ADCs (each having a respective analog processing portion and digital processing portion). Some or all of the ADCs may be adapted such that the lateral extent of their digital processing portion is greater than that of their analog processing portion. In an embodiment, the matrix of light-sensitive pixels may comprise 2K pixel columns, and a plurality of ADC blocks, e.g. each having 64 ADCs, may be designed to cover the whole 2K columns. According to an exemplary embodiment, all or at least one of said plurality of ADC blocks may be designed according to embodiments of the present description.

Thus, where the pitch of the pixel columns in a matrix of light-sensitive pixels is approximately 2.5 µm, the lateral space available for a respective analog processing portion of an ADC may also be 2.5 µm. However, according to proposed embodiments, the lateral space available for the digital processing portion of the same ADC will be a multiple of 2.5 µm and therefore provide more room for automated (or assisted) digital design processes to be implemented. For example, where the ADC block is adapted to process digital signals generated from 8 pixel columns having a pitch of approximately 2.5 µm, the lateral space available for a digital processing portion of a single ADC may be 20 µm (8×2.5). Similarly, where the ADC block is adapted to process digital signals generated from 32 pixel columns having a pitch of approximately 2.5 µm, the lateral space available for a digital processing portion of a single ADC of the ADC block may be 80 µm (32×2.5).

This latterly proposed concept may be understood as the rearranging the ensemble of the digital processing portions of all ADCs of an ADC block into at least one digital processing block adapted to be designed with automatic place and route tools.

Further, by grouping multiple digital processing portions of different ADCs into one or more digital processing blocks, the aspect ratio of each digital processing block can be fitted to enable the use of automatic place and route tools and by extension the use of digital design tools, thereby enabling processes such as automatic/digital synthesis, timing verification, and automatic test insertion. Aspect ratio means the choice of the lateral extent and the vertical extent, the latter being perpendicular to the lateral extent.

In an embodiment, the matrix of light-sensitive pixels may comprise 2K pixel columns, and the aspect ratio of the digital processing block may be selected to include the digital portions of all the 2K ADCs. Alternatively, the aspect ratio of the digital processing block may be selected to include the digital portions of only 64 ADCs, and therefore the corresponding ADC block of 64 ADCs will then be copied to cover the 2K columns.

Another aspect of the disclosed technology is a method of manufacturing an image sensor for converting incident light into digital signals. The method includes providing a matrix of light-sensitive pixels, the matrix being arranged in a plurality of pixel columns each having a first lateral extent. The method includes providing an analog-to-digital converter (ADC) block comprising a plurality of ADCs. Each ADC has an analog processing portion adapted to receive analog signals from a pixel column of the matrix and to generate digital signals from the received analog signals. Each ADC has a digital processing portion adapted to receive the digital signals from the analog processing portion. The step of providing an ADC block includes arranging a plurality of digital processing portions of multiple analog-to-digital converters into at least one digital processing block such that an aspect ratio of the digital processing block enables the use of automatic place and route tools. The step of providing an ADC block includes applying the automatic place and route tools to design the plurality of digital processing portions to allow a lateral extent of at least one of the digital processing portions to be greater than the lateral extent of its corresponding analog processing portion.

In other words, a digital processing block, comprising a plurality of digital processing portions of the ADC block, may be designed using such methodologies as computer aided design techniques, and at least one of the digital processing portions in the digital processing block may therefore be of a lateral extent greater than an associated analog processing portion of the same ADC.

The method may be further adapted in that the step of providing an ADC may comprise: adapting the analog processing portion of each of the plurality of ADCs to receive analog signals from one pixel column of the matrix and to generate digital signals from the received analog signals, and arranging the lateral extent of the analog processing portion to not exceed that of two times the lateral extent of a pixel columns.

Also, the analog processing portion of an ADC may be adapted to comprise a circuit arrangement adapted to input at least one analog signal having an infinite number of acceptable values and output at least one digital signal having a discrete set of acceptable values, and wherein the digital processing portion of the ADC comprises a circuit arrangement adapted to only input and output digital signals having a discrete set of acceptable values.

The matrix of light-sensitive pixels may comprise at least 8 pixel columns, the ADC block may comprise at least 8 ADCs each having an analog processing portion and a digital processing portion.

The method may be adapted such that the digital processing portion of each of the plurality of ADCs allows for digital synthesis and/or insertion of automatic testing techniques and/or timing verification.

According to an embodiment, an image sensor is provided with integrated ADC arrangement.

BRIEF DESCRIPTION OF THE DRAWINGS

Exemplary embodiments of the present description will now be described, with reference to the accompanying drawings.

DETAILED DESCRIPTION OF CERTAIN EMBODIMENTS

One aspect of the disclosed technology is an image sensor adapted to convert incident light into a digital signal. Such an image sensor includes a matrix of light-sensitive pixels ("pixel matrix") and an integrated analog-to-digital converter (ADC) block including a plurality of ADCs. Each ADC includes an analog processing portion and a digital processing portion. The analog processing portion receives analog signals from a pixel column of the matrix and generates digital signals from the received analog signals. The digital processing portion receives digital signals from the analog processing portion and processes them using a digital processing resource or capability. The width or lateral extent of the digital processing portion of an ADC is greater than the width or lateral extent of the analog processing portion of the ADC. Allocating increased width for the digital processing portion enables the use of modern, automated digital design processes to design and/or arrange the components and/or layout of the digital processing portion. As a result, the digital processing portion may have a flexible and irregular structure which is not limited by the width of the analog processing portion(s) and/or the width (i.e. pitch) of pixel columns of an associated matrix.

Figure 1:
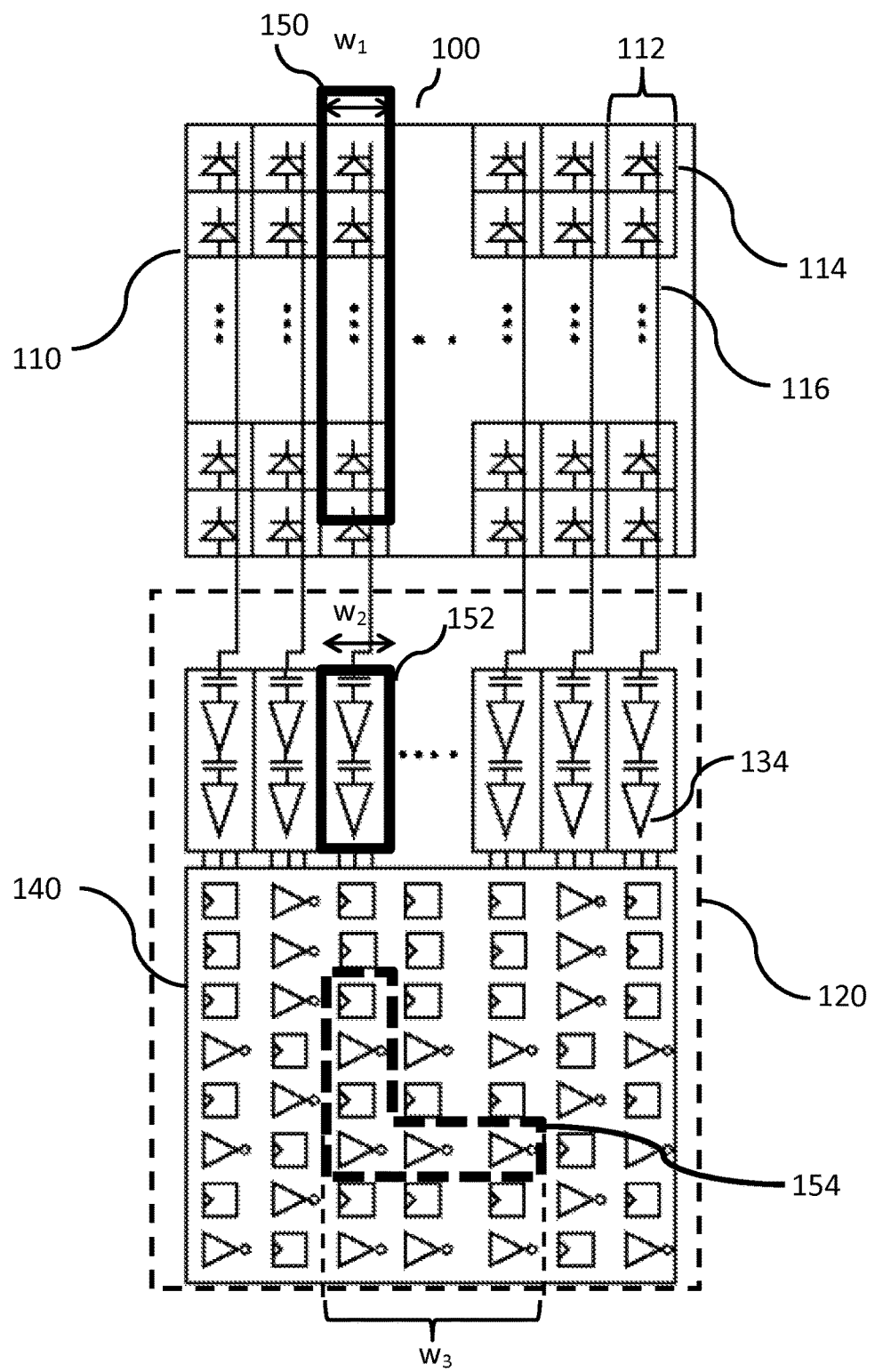
FIG. 1 illustrates an exemplary image sensor according to the disclosed technology.

FIG. 1 illustrates an exemplary image sensor according to the disclosed technology. The image sensor 100 consists of a matrix of light-sensitive pixels ("pixel matrix") 110, arranged into a plurality of pixel columns and an analog-to-digital converter (ADC) block 120. The ADC block 120 includes a plurality of ADCs each having an analog processing portion 152 and digital processing portion 154.

In the embodiment shown in FIG. 1, when light is incident on a pixel 114 in the pixel matrix 110, an analog signal is generated. Each pixel 114 in a pixel column 112 transfers this analog signal as an output using a column-line 116. Each pixel column 112 has a single output, which can selectively choose analog data from any single pixel 114 in that column, using a method and/or electronic component such as a multiplexer. The output of each pixel column is consequently provided as a possible input for the ADC block 120.

The ADC block 120 includes a plurality of ADCs each having an analog processing portion 152 and a digital processing portion 154. In this example, the analog processing portion 152 of each ADC receives an analog signal from a respective pixel column 112 to generate digital signals from the received analog signals. In this example, there are an equal number of ADCs (and analog processing portions) and pixel columns, The output of each pixel column provides the input for a single, different ADC. Each ADC thus processes the respective analog input from their associated pixel column to generate digital signals. Providing a single ADC per associated pixel column in such a manner permits a design for maximum similarity to be introduced, and may reduce fixed pattern noise in sensed images sensed.

In each ADC, the digital processing portion 154 is adapted to receive digital signals from the corresponding analog processing portion 152 and to process the received signals. In other words, in each ADC, the digital outputs from the analog processing portion 152 of the ADC are passed as inputs to the digital processing portion 154 of the ADC to be further processed. Thus, in this example, each digital processing portion 154 can be considered to separately process digital signals received from a single, different, analog processing portion.

The lateral extent or pitch of any single pixel column 150 in the exemplary embodiment shown in FIG. 1 is $w_1$. According to an exemplary embodiment, the single associated ADC has an analog processing portion 152 with a lateral extent $w_2$ of the same, or smaller, than the lateral extent $w_1$ of the pixel column 150, such that $w_2 \leq w_1$. Also, the single associated ADC has a an associated digital processing portion 154 with a lateral extent $w_3$ that is greater than the lateral extent $w_1$ of the single pixel column and the lateral extent $w_2$ of the analog processing portion, such that $w_3>w_2$ and $w_3>w_1$.

In such configurations, the lateral space provided for the digital processing portion 152 may be greater than an individual analog processing portion. The digital processing portion may, therefore, not be limited in width by association with a respective pixel column. This may allow for the use of previously unavailable automated design processes or computer aided design (CAD) methodologies. Such configurations may also permit arrangements which improve the digital processing capabilities of the digital-processing design. This may confer, for example, such benefits as improved speed of processing, reduced energy expenditure of processing and/or more complex digital processing design implementation.

Thus, in an embodiment, the digital processing portions 154 of a plurality of ADCs may be arranged into at least one digital processing block 140. For example, depending on the number of ADCs in the design, the digital processing portions 154 of 8, 32 or 64 ADCs may be arranged together to form one, two or more digital processing blocks. In a further embodiment, the at least one digital processing block 140 is arranged by an automated design process; however the analog processing portions are generally not arranged by an automated design process, but rather, for example, designed by schematic entry and manual layout.

Alternatively, however, according to another exemplary embodiment, an analog processing portion 152 of an ADC may be adapted to receive analog signals from only one pixel column of the matrix, and the lateral extent of the analog processing portion may not exceed that of two pixel columns. For example, as shown in the embodiment depicted in FIG. 1, each pixel column may only be associated with a different, unique ADC such that the analog processing portion of each ADC is associated with a single pixel column.

It may otherwise be beneficial, to ensure a suitable lateral space for a digital processing portion of an ADC for example, to provide an image sensor adapted such that the matrix of light-sensitive pixels comprises at least 8 pixel columns, and wherein the ADC block 120 comprises at least 8 ADCs. The available lateral extent that may be made available for a digital processing portion 154 of one of the at least 8 ADCs may then be equivalent to the total lateral extent of the at least 8 pixel columns.

In an exemplary embodiment, the pixel matrix may consist of at least 32 or 64 pixel columns respectively. That is to say that the image sensor includes a pixel matrix, comprising at least either 32 or 64 columns of pixels, wherein each column of pixels provides an input to a respective ADC having an analog processing portion and a digital processing portion, such that there is provided either 32 or 64 ADCs.

In an embodiment, the maximum lateral extent of the digital processing block may be the total lateral extent of the light sensitive pixel matrix.

To aid further understanding of an ADC arrangement embodied in FIG. 1, an ADC may be split into two distinct parts or portions, based upon the nature of the signal(s) processed by each portion, such as an analog processing portion and a digital processing portion. The analog processing portion includes a circuit arrangement adapted to input at least one analog signal having an infinite number of acceptable values. The digital processing portion includes a circuit arrangement adapted to only input and only output digital signals having a discrete set of acceptable values.

A digital signal output from an analog processing portions 152 is typically the discretized signal output from analog components, for example a comparator 134. Conversely a digital signal output from a digital processing portion 154 is typically the digital output of purely digital components, comprising solely of digital logic gates, for example a digital encoder.

In an embodiment, the digital output from a digital processing portion is encoded.

An embodiment may also enable automatic methods for design for manufacturability, including automatic test insertion (such as scan chains or build in self test), and/or digital synthesis. These automatic methods can improve test time and/or test quality.

The use of CAD methodologies also permits faster digital redesign cycles due to the nature of working in an automated environment. Working with computer aided digital design packages also provides the benefit that timing verification can be conducted using timing analysis tools adapted to work at the appropriate level of digital complexity.

Figure 2:
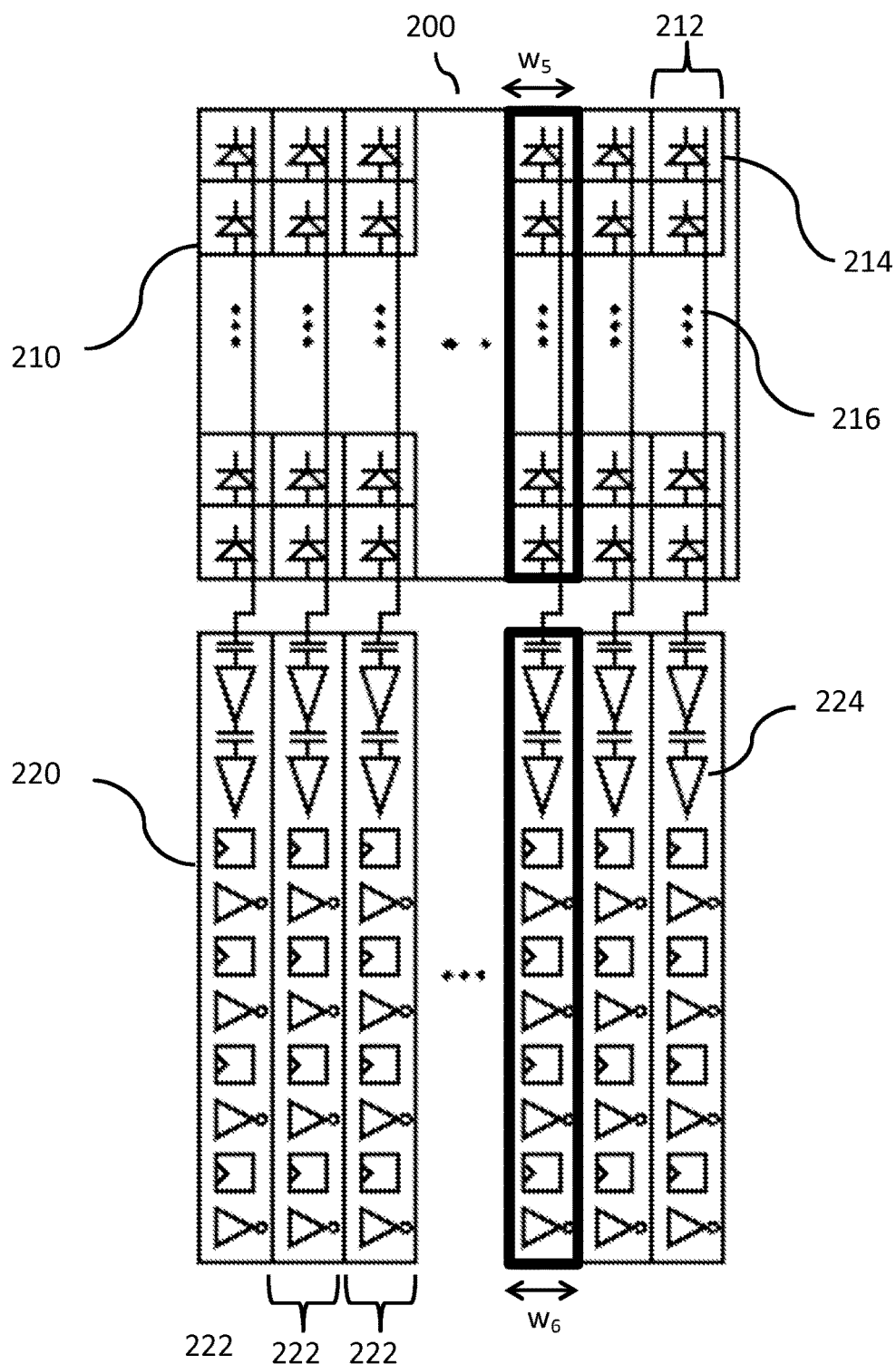
FIG. 2 is a schematic of a typical state-of-the-art image sensor.

FIG. 2 is a schematic of a typical state-of-the-art image sensor 200. In this typical image sensor 200, sensor 200 includes light-sensitive pixel matrix ("pixel matrix") 210 and an analog-to-digital converter (ADC) block 220, comprising a plurality of individual ADCs 222.

When incident light hits a pixel 214 in the pixel matrix 210, an analog signal is generated. Each pixel 214 in a pixel column 212 transfers this analog signal as an output using a column-line 216. Each pixel column 212 has a single output, which can selectively choose analog data from any single pixel 214 using a method and/or electronic component such as a multiplexer. The output of the pixel columns is consequently provided as possible inputs for the ADC block 220. Thus, each pixel column is associated with a unique ADC 222.

Typical image sensor 200 does not split individual ADCs into an analog processing portion and a digital processing portion. Thus, each output of the pixel column 212 is individually converted from an analog signal to a digital signal using a respective full ADC 222. Therefore, there as many individual ADCs as there are pixel columns, with each pixel column associated with a single individual ADC.

This approach may limit the lateral space available to each individual ADC to the lateral extent of the pixel column 212. Therefore, the lateral extent of a full, individual ADC ($w_6$) is no greater than the lateral extent of the respective pixel column ($w_5$), such that $w_6 \leq w_5$.

These small pixel column widths limit the use of automated design processes for place and route of digital circuits; therefore, the benefits of using automated design processes are limited compared to handling a grouped set of digital portions on multiple ADCs. As a result circuit designers need to hand-craft digital circuits using schematic entry and manual layout. This approach is more time consuming, costly, are requires designers with a high level of skill.

Furthermore, each individual ADC 222 within the state-of-the-art image sensor shown in FIG. 2 is typically designed for maximum similarity column to column, to avoid, for example, fixed pattern noise in the images collected, introducing a concern in how best to master the layout. By applying the concept of splitting an individual ADC into an analog processing portion and a digital processing portion, this concern may be mitigated by allowing for the analog processing portion to ensure similarity requirements are met, whilst allowing a less periodic and more flexible approach to design of the digital processing portion. In such a manner, layout optimization may be performed automatically using computer aided design techniques.

Figures 3A, 3B:
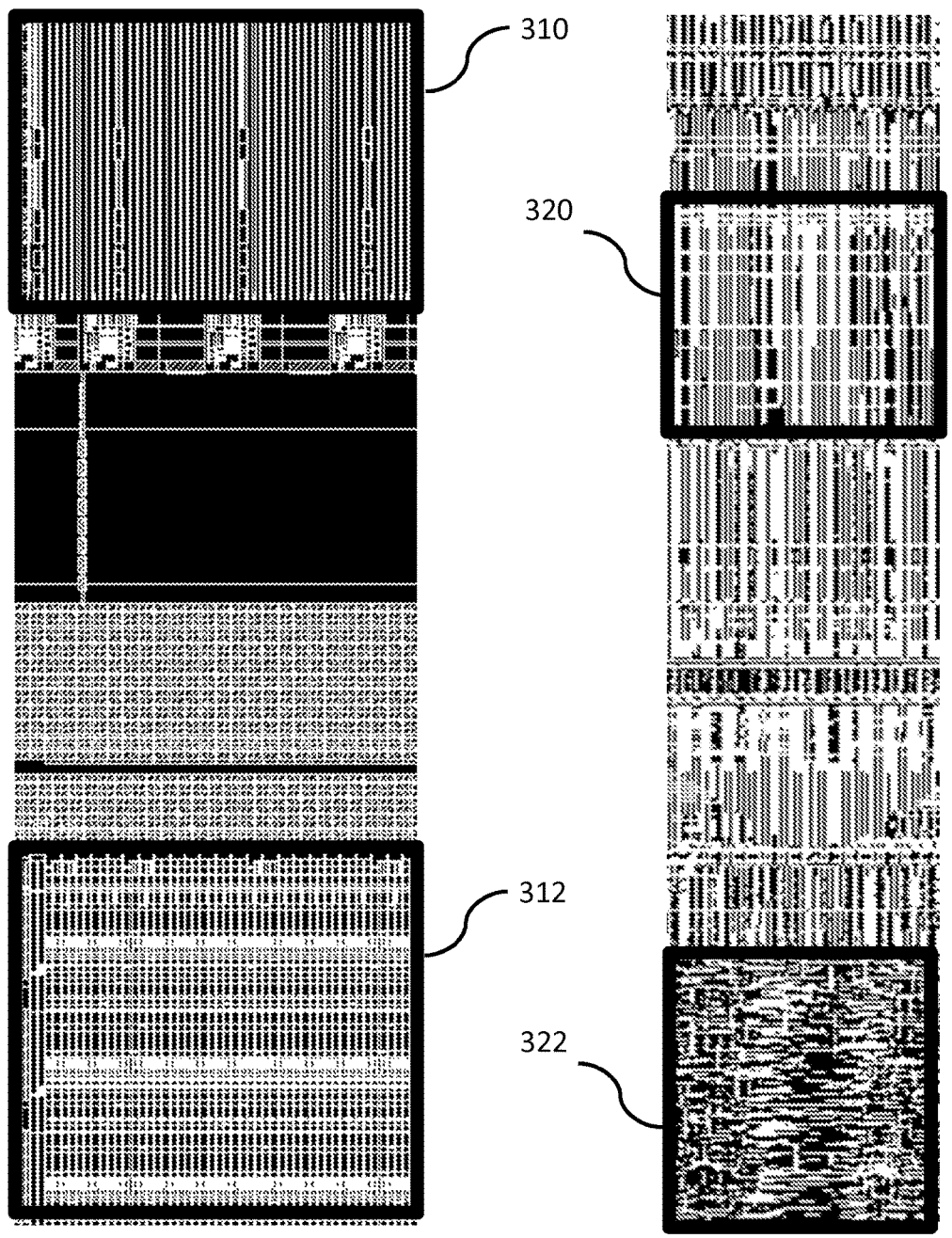
FIG. 3A illustrates an analog-to-digital converter chip layout for an image sensor according to the typical state-of-the-art.
FIG. 3B depicts an analog-to-digital converter chip layout for an exemplary image sensor according to the disclosed technology.

Turning to FIGS. 3A and 3B, the advantages over the current state-of-the art can be more readily seen.

FIG. 3A depicts a traditional image sensor design layout, wherein the analog processing portion 310 and the digital processing portion 312 are considered inseparable as in a typical analog-to-digital converter (ADC) understanding. The analog processing portion and the digital processing portions therefore have a repeated layout, periodic to the lateral width of the pixel columns 212 (not depicted in FIG. 3A). That is to say, the complete ADC block 220 for the image sensor comprises a repeated layout of separate, individual ADCs 222, wherein all analog and digital processing for an associated pixel column is performed and wherein the width of each separate ADC is limited by the associated pixel column width.

FIG. 3B depicts an analog-to-digital converter chip layout for an exemplary image sensor according to the disclosed technology. Each ADC is split into analog and digital processing portions as disclosed herein and the image sensor adapted accordingly. Thus, the analog processing portions 320 are maintained in a repeated layout, limited by the lateral width of the pixel columns 112 (not depicted in FIG. 3B). However, the digital processing portion of each ADC in the ADC block 322 has a layout such that digital cell placing is not constrained by regularity. In other words, the digital processing portions of the ADCs in the ADC block 322 are not required to have a periodic layout, which allows for a larger lateral space for designs to be arranged. This can allow for the use of automated design processes for place and route methodologies.

Figure 4:
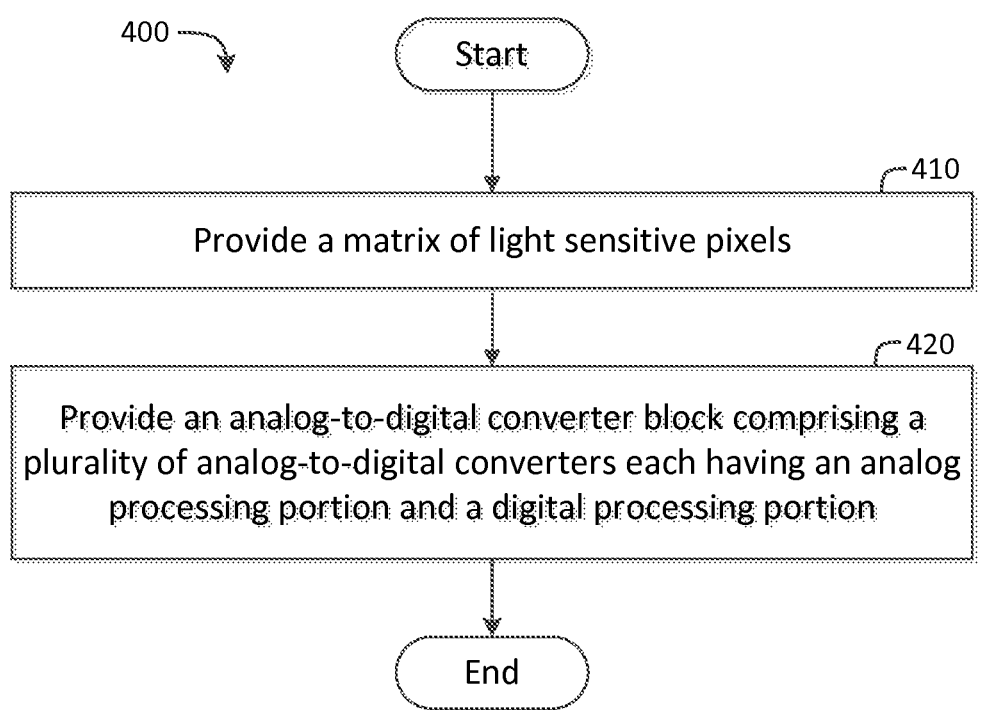
FIG. 4 is a flowchart illustrating an embodiment of a method of manufacturing an image sensor according to the disclosed technology.

FIG. 4 is a flowchart illustrating an embodiment of a method 400 of manufacturing an image sensor for converting incident light into digital signals according to the disclosed technology. In step 410, method 400 method provides a matrix of light-sensitive pixels, the matrix being arranged in a plurality of pixel columns. Each of the plurality of pixel columns has a first lateral extent. In step 420, method 400 provides an analog-to-digital converter (ADC) block comprising a plurality of ADCs. Each ADC has an analog processing portion adapted to receive an analog signal from a pixel column of the matrix and to generate digital signals from the received analog signal. Each ADC has a digital processing portion adapted to receive the digital signals from the corresponding analog processing portion. Step 420 includes arranging a plurality of digital processing portions of multiple analog-to-digital converers into at least one digital processing block such that an aspect ratio of the digital processing block enables the use of automatic place and route tools. In an embodiment, step 420 includes allocating, for each of the plurality of ADCs, the lateral extent of the digital processing portion to be greater than the lateral extent of the analog processing portion. Based on the allocated lateral extent of the digital processing portion of each of the plurality of ADCs, step 420 applies the automatic place and route tools to design the plurality of digital processing portions, and thereby allowing a lateral extent of at least one of the digital processing portions to be greater than a lateral extent of its corresponding analog processing portion.

A digital processing portion of an ADC may, therefore, be designed using such methods as computer aided design (such as automatic place and route tools) with the limitation that the lateral extent is no smaller than the lateral extent of the associated analog processing portion of the ADC. This method may therefore allow for a faster turn-around time of the digital design, with automatic measures for design for manufacturability such as automatic test insertion, digital synthesis and/or timing verification (for example, scan chains, or built in self test).

The method may be further adapted such that the step of providing an ADC includes, for each of the plurality of ADCs, adapting the analog processing portion to receive analog signals from one column of the matrix and to generate digital signals from the received analog signals; and arranging the lateral extent of the analog processing portion to not exceed that of two pixel columns.

Alternative adaptations of the method or operations that may be included in the method include: adapting the digital processing portion to allow for measures for multiple iterations of digital design; adjusting the lateral extent provided to the digital processing portion dependent upon digital design complexity; designing the digital processing portion automatically and consequently performing schematic and manual layout designs based upon these automatic designs; and providing a feedback signal from the digital processing portion to the analog processing portion.

Various other modifications will be apparent to those skilled in the art.

What is claimed is:

1. An image sensor for converting incident light into digital signals, the image sensor comprising:
   a matrix of light-sensitive pixels, the matrix being arranged in a plurality of pixel columns each having a first lateral extent; and
   an analog-to-digital converter block comprising a plurality of analog-to-digital converters, each of the plurality of analog-to-digital (ADC) converters comprising:
      an analog processing portion adapted to receive an analog signal from one of the plurality of pixel columns and to generate a digital signal from the received analog signal, the analog processing portion having a corresponding second lateral extent; and
      a digital processing portion adapted to receive the digital signal from the corresponding analog processing portion, the digital processing portion having a corresponding third lateral extent greater than the corresponding second lateral extent;
   wherein, for each of the ADC converters, the analog processing portion and the digital processing portion are split based on analog signals being processed by each ADC converter;
   wherein the analog processing portion comprises a circuit arrangement adapted to input the analog signal having an infinite number of acceptable values and output the digital signal having a discrete set of acceptable values, and wherein the digital processing portion comprises a circuit arrangement adapted to only input and output digital signals having a discrete set of acceptable values; and
   wherein, in each of the ADC converters, the digital signal output from the analog processing portion comprises a discretized signal output from one or more analog components.

2. The image sensor of claim 1, wherein, for each of the plurality of analog-to-digital converters, the corresponding second lateral extent does not exceed two times the corresponding first lateral extent.

3. The image sensor of claim 1, wherein the matrix of light-sensitive pixels comprises at least 8 pixel columns, and wherein the analog-to-digital converter block comprises at least 8 analog-to-digital converters.

4. The image sensor of claim 1, wherein the plurality of the digital processing portions of the analog-to-digital converter block are arranged into at least one digital processing block such that an aspect ratio of the at least one digital processing block is suitable for use of automatic place and route tools.

5. The image sensor of claim 4, wherein the at least one digital processing block is adapted to allow for digital synthesis and/or insertion of automatic testing techniques and/or timing verification.

6. An electronic device comprising an image sensor according to claim 1.

7. The image sensor of claim 2, wherein the matrix of light-sensitive pixels comprises at least 8 pixel columns, and wherein the analog-to-digital converter block comprises at least 8 analog-to-digital converters.

8. The image sensor of claim 1, wherein, within each of the plurality of ADC converters, the split between the analog processing portion and the digital processing portion of each ADC converter is located at the one or more components that provide the discretized signal.

9. The image sensor of claim 1, wherein the one or more components that provide the discretized signal comprise a comparator.

10. A method of manufacturing an image sensor for converting incident light into digital signals, the method comprising:
 providing a matrix of light-sensitive pixels, the matrix being arranged in a plurality of pixel columns each having a first lateral extent; and
 providing an analog-to-digital converter block comprising a plurality of analog-to-digital converters each having:
  an analog processing portion adapted to receive an analog signal from a pixel column of the matrix and to generate a digital signal from the received analog signal; and a digital processing portion adapted to receive the digital signal from the corresponding analog processing portion,
 wherein providing an analog-to-digital converter block comprises:
  arranging a plurality of digital processing portions of multiple analog-to-digital converters into at least one digital processing block such that an aspect ratio of the digital processing block enables the use of automatic place and route tools; and
  applying said automatic place and route tools to design said plurality of digital processing portions and thereby allowing a lateral extent of at least one of the digital processing portions to be greater than a lateral extent of its corresponding analog processing portion;
 wherein, for each of the ADC converters, the analog processing portion and the digital processing portion are split based on analog signals being processed by each ADC converter;
 wherein the analog processing portion of an analog-to-digital converter comprises a circuit arrangement adapted to input the analog signal having an infinite number of acceptable values and output the digital signal having a discrete set of acceptable values, and wherein the digital processing portion of the analog-to-digital converter comprises a circuit arrangement adapted to only input and output digital signals having a discrete set of acceptable values; and
 wherein, in each of the ADC converters, the digital signal output from the analog processing portion comprises a discretized signal output from one or more analog components.

11. The method of claim 10, wherein providing an analog-to-digital converter block comprises, for each of the plurality of analog-to-digital converters, arranging a lateral extent of the analog processing portion to not exceed that of two times the first lateral extent.

12. The method of claim 10, wherein the matrix of light-sensitive pixels comprises at least 8 pixel columns, and wherein the analog-to-digital converter block comprises at least 8 analog-to-digital converters.

13. The method of claim 10, wherein the at least one digital processing block is adapted to allow for at least one of digital synthesis, insertion of automatic testing techniques, and timing verification.

14. An image sensor for converting incident light into digital signals, the image sensor comprising:
 a matrix of light-sensitive pixels, the matrix being arranged in a plurality of pixel columns each having a first lateral extent; and
 an analog-to-digital converter block comprising a plurality of analog-to-digital converters, each of the plurality of analog-to-digital converters comprising:
  an analog processing portion adapted to receive an analog signal from one of the plurality of pixel columns and to generate a digital signal from the received analog signal, the analog processing portion having a corresponding second lateral extent; and
  a digital processing portion adapted to receive the digital signal from the corresponding analog processing portion, the digital processing portion having a corresponding third lateral extent greater than the corresponding second lateral extent;
 wherein, for each of the plurality of analog-to-digital converters, the corresponding second lateral extent does not exceed two times the corresponding first lateral extent;
 the analog processing portion comprises a circuit arrangement adapted to input the analog signal having an infinite number of acceptable values and output the digital signal having a discrete set of acceptable values, and wherein the digital processing portion comprises a circuit arrangement adapted to only input and output digital signals having a discrete set of acceptable values;
 wherein the matrix of light-sensitive pixels comprises at least 8 pixel columns, and wherein the analog-to-digital converter block comprises at least 8 analog-to-digital converters;
 wherein, for each of the ADC converters, the analog processing portion and the digital processing portion are split based on analog signals being processed by each ADC converter; and
 wherein, in each of the ADC converters, the digital signal output from the analog processing portion comprises a discretized signal output from one or more analog components.

15. The image sensor of claim 14, wherein the at least one digital processing block is adapted to allow for digital synthesis and/or insertion of automatic testing techniques and/or timing verification.

16. The image sensor of claim 14, wherein the plurality of the digital processing portions of the analog-to-digital converter block are arranged into at least one digital processing block such that an aspect ratio of the at least one digital processing block is suitable for use of automatic place and route tools.

17. The image sensor of claim 14, wherein, within each of the plurality of ADC converters, the split between the analog processing portion and the digital processing portion of each ADC converter is located at the one or more components that provide the discretized signal.

18. The method of claim 10, wherein the plurality of the digital processing portions of the analog-to-digital converter block are arranged into at least one digital processing block such that an aspect ratio of the at least one digital processing block is suitable for use of automatic place and route tools.

19. The method of claim 10, wherein, within each of the plurality of ADC converters, the split between the analog processing portion and the digital processing portion of each ADC converter is located at the one or more components that provide the discretized signal.

20. The method of claim 10, wherein, within each of the plurality of ADC converters, the one or more components that provide the discretized signal comprise a comparator.

* * * * *